United States Patent
Kirinaka et al.

[11] Patent Number: 6,052,742
[45] Date of Patent: Apr. 18, 2000

[54] HOST MACHINE INTERFACE FOR READING INFORMATION STORED IN PERIPHERAL CARD PRIOR TO PROVIDING OPERATIONAL SUPPLY VOLTAGE TO THE CARD

[75] Inventors: Masaki Kirinaka; Hiroaki Watanabe, both of Yokohama; Tetsuhiko Endoh; Ryuji Tanaka, both of Kawasaki, all of Japan

[73] Assignee: Fujitsu Limited, Kawasaki, Japan

[21] Appl. No.: 09/040,371

[22] Filed: Mar. 18, 1998

[30] Foreign Application Priority Data

Oct. 16, 1997 [JP] Japan ................................. 9-284016

[51] Int. Cl.[7] .............................. G06F 13/00; G06F 1/32
[52] U.S. Cl. ................. 710/10; 710/14; 710/102; 713/320; 326/80
[58] Field of Search .............................. 713/320; 326/80; 710/10, 14, 102

[56] References Cited

U.S. PATENT DOCUMENTS

| | | | |
|---|---|---|---|
| 5,440,244 | 8/1995 | Richter et al. | 326/37 |
| 5,532,945 | 7/1996 | Robinson | 713/321 |
| 5,546,590 | 8/1996 | Pierce | 713/323 |
| 5,606,704 | 2/1997 | Pierce et al. | 713/322 |
| 5,613,130 | 3/1997 | Teng et al. | 713/300 |
| 5,634,132 | 5/1997 | Pearce et al. | 713/300 |
| 5,758,171 | 5/1998 | Ramamurthy et al. | 713/300 |
| 5,768,605 | 6/1998 | Fuller et al. | 713/324 |
| 5,805,473 | 9/1998 | Hadderman | 713/321 |
| 5,862,393 | 1/1999 | Davis | 713/300 |

FOREIGN PATENT DOCUMENTS

| | | |
|---|---|---|
| 407281800A | 10/1995 | Japan . |
| 408211973A | 8/1996 | Japan . |
| 410049257A | 2/1998 | Japan . |

*Primary Examiner*—Thomas C. Lee
*Assistant Examiner*—Albert Wang
*Attorney, Agent, or Firm*—Staas & Halsey LLP

[57] ABSTRACT

An interface between a card-type peripheral device and a host machine, such as a PC, determines the operational supply voltage required to operate the peripheral device prior to the host machine supplying the operational supply voltage to the peripheral device. The host machine first receives information stored on the peripheral device specifying the operational voltage required to operate the peripheral device. The host machine then generates the proper operational supply voltage and provides it to the peripheral device. The interface prevents damage to the peripheral device due to the host machine supplying an incorrect operational voltage.

16 Claims, 6 Drawing Sheets

HOST MACHINE INTERFACE FOR READING INFORMATION STORED IN PERIPHERAL CARD PRIOR TO PROVIDING OPERATIONAL SUPPLY VOLTAGE TO THE CARD

BACKGROUND OF THE INVENTION

The present invention relates generally to a peripheral device which is connected to a host machine and, more particularly, to an improved means of connecting and interfacing the peripheral device to the host machine.

Recently, card-type expansion devices like PC cards have been used to connect a peripheral device to a host machine such as a microcomputer in order to expand the functions of the host machine. A card-type expansion device includes a memory card which provides a host machine with a memory function and a communication card which provides the host machine with an interface circuit function. Such card-type expansion devices generally comprise a credit card sized board with functional circuits mounted thereon.

A host machine has a card slot for installing the card-type expansion device. When the connector of the card-type expansion device is connected to the connector of the card slot of the host machine, the card-type expansion device receives drive power from the host machine via the connectors and communicates with the host machine to provide a predetermined function.

In some cases, however, although the connectors match in shape with each other, the physical specifications such as the supply voltage of both the expansion device and the host machine may not match with each other. For instance, a card-type expansion device which is supplied with an operational supply voltage of 3 V cannot be used in a host machine passes an operational supply voltage of 5 V to connected devices. In this respect, each user should check the specifications of a host machine and select a card-type expansion device suitable for use in the host machine.

Accordingly, it is an object of the present invention to provide an improved connection between a host machine and a card device, which does not require the user to check for supply voltage compatibility.

SUMMARY OF THE INVENTION

Briefly stated, the present invention provides a method of reading information stored in a card device attachable to a host machine. The card device receives an operational supply voltage from the host machine. The method includes the steps of: attaching the card device to the host machine; the card device generating a voltage signal corresponding to the card information stored in the card device; and the host machine acquiring the card information from the generated voltage signal, prior to supplying the operational supply voltage to the card device.

The present invention provides a card device which receives an operational supply voltage from a host machine. The card device includes: a card main circuit for providing a host machine with a predetermined function when the card device is connected to the host machine and receives the operational supply voltage from the host machine; and a card information holding circuit for storing predetermined card information, the card information holding circuit generating an analog signal corresponding to the predetermined card information when the card device is connected to the host machine and prior to the card device receiving the operational supply voltage from the host machine.

The present invention provides a host machine for acquiring a predetermined function from a card device having a predetermined function when the card device is connected to the host machine and receiving an operational supply voltage from the host machine. The card device has stored thereon specification information and generating an analog signal corresponding to the specification information when the card device is connected to the host machine. The host machine includes a card information reading circuit for receiving the analog signal from the card device and determining the specification information based on the analog signal, prior to the host machine supplying the operational supply voltage to the card device.

The present invention provides a drive unit connectable between a card device and a host machine. The card device stores card information and generates a first signal corresponding to the card information when connected to the drive unit. The card device receives an operational supply voltage from one of the drive unit and the host machine. The drive unit comprising a card information reading circuit for receiving the first signal from the card device, determining the card information therefrom, and supplying the card information to the host machine, prior to the card device receiving the operational supply voltage.

The present invention provides a method of interfacing a card-type peripheral device to a host machine. The method includes the steps of: connecting the peripheral device to a connector of the host machine; the host machine reading information stored on the peripheral device; the host machine generating an operational voltage based on the information read from the peripheral device; and the host machine providing the generated operational voltage to the peripheral device, thereby allowing the peripheral device to perform its intended function.

The present invention provides a card device connectable to a host machine which receives an operational supply voltage from the host machine. The card device includes: a card main circuit for performing a predetermined function when supplied with the operational supply voltage from the host machine; and a card information holding circuit for storing card device specification information, wherein the card information holding circuit generates an analog voltage signal corresponding to the card device specification information when the card device is connected to the host machine and prior to the card device receiving the operational supply voltage from the host machine.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
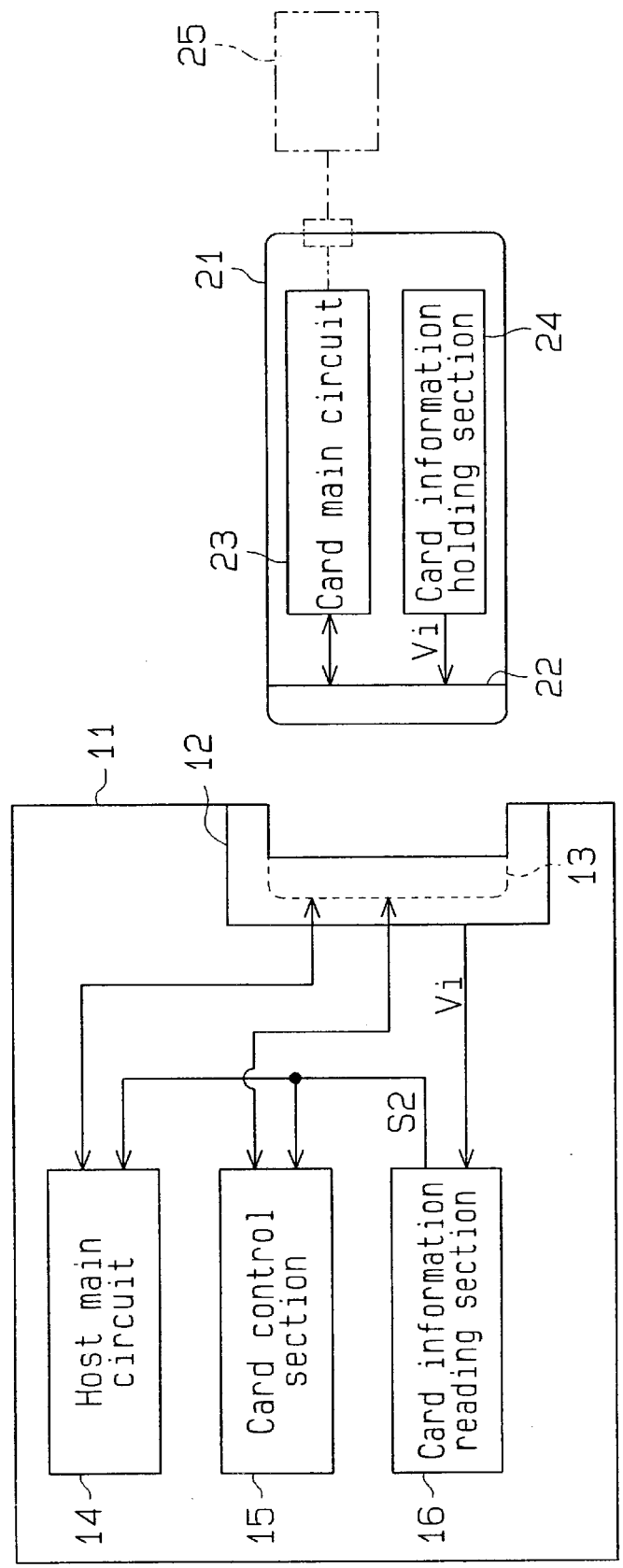
FIG. 1 is a schematic block diagram of a host machine and a card-type expansion device according to one embodiment of the present invention.

FIG. 1 presents a schematic block diagram of a host machine 11 such as a personal computer, and a card-type expansion device 21. The host machine 11 has a card slot 12 which has a host connector 13 for receiving the card-type expansion device 21. The card-type expansion device 12 has a card connector 22 connectable to the host connector 13.

The host machine 11 includes a host main circuit 14, a card control section 15 and a card information reading section 16. The card-type expansion device 21 includes a card main circuit 23 and a card information holding section 24.

The host main circuit 14 includes various circuits (not shown), such as a CPU, a memory and an interface circuit, which provide the main functions of the host machine 11. The host main circuit 14 includes a card controller (not shown) which exchanges data with the card main circuit 23 of the card-type expansion device 21 via connectors 13 and 22.

The card main circuit 23, which is connected to the connector 22, provides the host main circuit 14 with a preset function (e.g., a memory function of a RAM, ROM or the like or an interface function for the expansion device 21 of an external unit 25).

The card information holding section 24 stores card information preset for various associated card-type expansion devices. Card information includes the function of the card main circuit 23 and the physical specification of the operational supply voltage of the card main circuit 23. The card information holding section 24, connected to the connector 22, sends an analog signal Vi indicative of the card information, to the connector 22 when the card-type expansion device 21 is connected to the host machine 11.

The card information reading section 16 detects the installment and uninstallment of the card-type expansion device 21, and reads the card information held in the card information holding section 24 when the card-type expansion device 21 is inserted in the card slot 12 and connected to the host machine 11. The card information reading section 16 recognizes the function and the physical specification of the card-type expansion device 21, based on the read card information transmitted thereto via the analog signal Vi. Based on the recognition of the function and the physical specification, the card information reading section 16 sends an instruction signal S2 to the card control section 15. The card control section 15 outputs a card control signal to the expansion device 21 for controlling the card main circuit 23 in response to the instruction signal S2.

The card main circuit 23 is enabled when receiving the card control signal from the card control section 15 via the connectors 13 and 22. That is, the host machine 11 determines the function and the physical specification of the card-type expansion device 21 and outputs the card control signal for operating the particular card-type expansion device 21 that has been connected to the host machine 11. According to the present embodiment, a card voltage Vc having a value corresponding to the operational supply voltage is supplied to the card-type expansion device 21 from the host machine 11. This allows a user to install the expansion device 21 in the host machine 11 without having to specify the function and the physical specification of the expansion device 21. Instead of the card main circuit 23 receiving the card control signal, the host main circuit 14 may receive the card control signal and access the card main circuit 23 directly.

Figure 2:
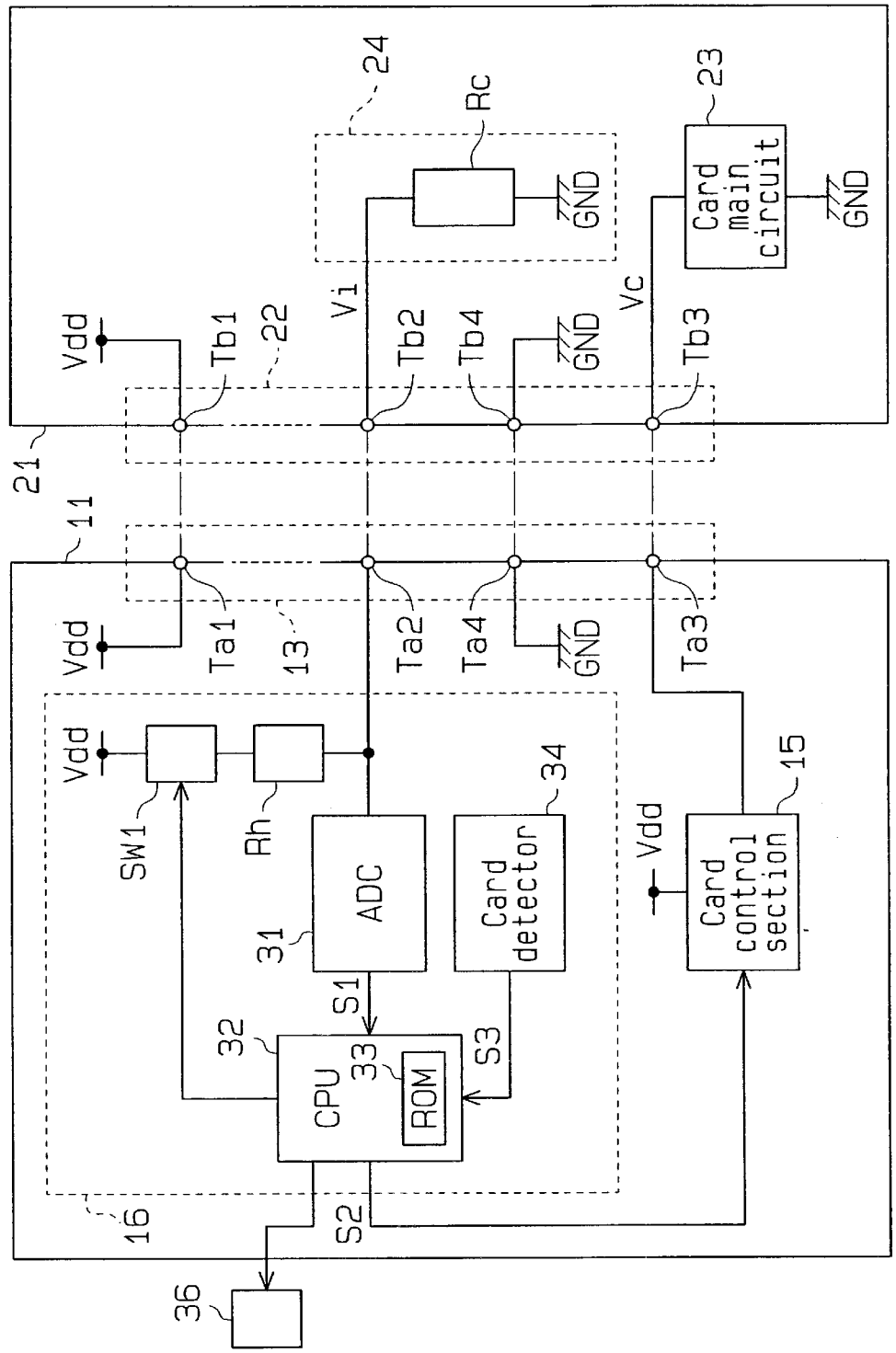
FIG. 2 is a schematic block diagram showing a card information reading section of the host machine and a card information holding section of the card-type expansion device both shown in FIG. 1.

As shown in FIG. 2, the host connector 13 and the card connector 22 have the same numbers of (four in this case) terminals Ta1 to Ta4 and Tb1 to Tb4. The first terminals Ta1 and Tb1 are used to supply a high-potential supply voltage (the operational supply voltage of the host main circuit 14) Vdd to the card-type expansion device 21 from the host machine 11. The second terminals Ta2 and Tb2 are used to supply card information (e.g., data), stored in the card information holding section 24, to the card information reading section 16. The third terminals Ta3 and Tb3 are used to supply the card control signal to the card-type expansion device 21 from the host machine 11. The fourth terminals Ta4 and Tb4 are used to supply a lowpotential supply voltage (0 V or ground GND in this embodiment) to the card-type expansion device 21 from the host machine 11.

The card information holding section 24 preferably includes a resistor Rc whose resistance corresponds to the card information of the card-type expansion device 21. The resistor Rc has a first terminal connected to the second terminal Tb2 of the card connector 22 and a second terminal connected to the ground GND. The second terminal Tb2 of the card connector 22 is connected to the card information reading section 16 via the second terminal Ta2 of the host connector 13.

The card information reading section 16 includes an AD (Analog to Digital) converter (ADC) 31, a CPU 32, a card detector 34, a resistor Rh and a first switch SW1. The ADC 31 has an input terminal connected to the second terminal Ta2 of the connector 13. The resistor Rh has a first terminal also connected to the second terminal Ta2 and a second terminal connected via the first switch SW1 to the high-potential power supply Vdd.

When both of the connectors 13 and 22 are electrically connected together, the CPU 32 switches on (closes) the first switch SW1 to read the card information. Then, the resistors Rc and Rh are connected in series between the high-potential power supply Vdd and the ground GND. Consequently, the potential difference between the high-potential power supply Vdd and the ground GND is divided in accordance with the resistances of the resistors Rc and Rh, and the divided voltage is applied to the second terminal Ta2 and the first terminal of the resistor Rc. The ADC 31 receives a voltage signal Vi of the resistor Rc (analog signal representing the card information), and converts the analog signal to a digital signal which is in turn supplied to the CPU 32. When both of the connectors 22 and 13 are not electrically connected together, the voltage at the second terminal Ta2 of the connector 13 is held at the high-potential supply voltage Vdd.

Figure 3:
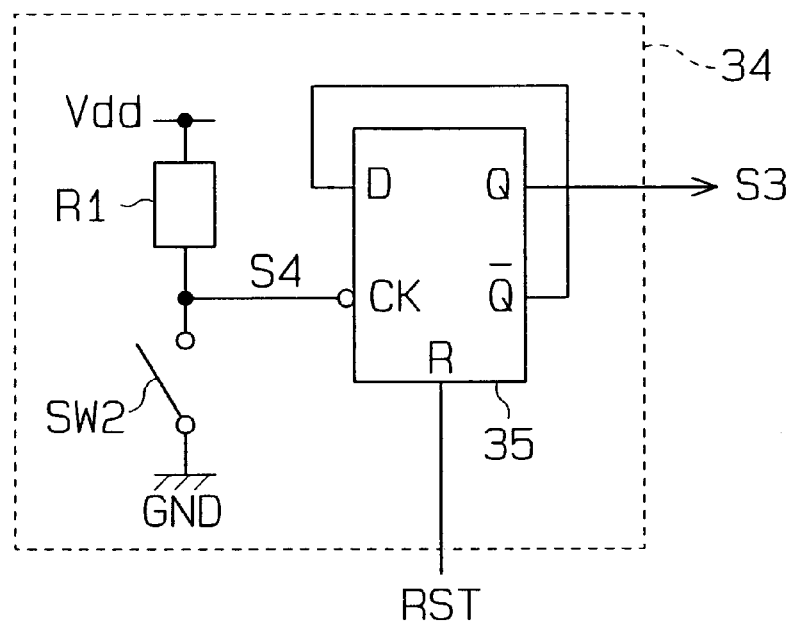
FIG. 3 is a schematic circuit diagram of a card detector in the card information reading section in FIG. 2.

As shown in FIG. 3, the card detector 34 includes a resistor R1, a second switch SW2 and a flip-flop (FF) circuit 35. The resistor R1 and the switch SW2 are connected in series between the high-potential power supply Vdd and the ground GND. The FF circuit 35 has a clock input terminal CK connected to a node between the resistor R1 and the switch SW2, a data input terminal D, an output terminal Q for outputting a detection signal S3, an inverting output terminal /Q connected to the data input terminal D, and a reset terminal R for receiving a reset signal RST from the CPU 32.

Figure 4:
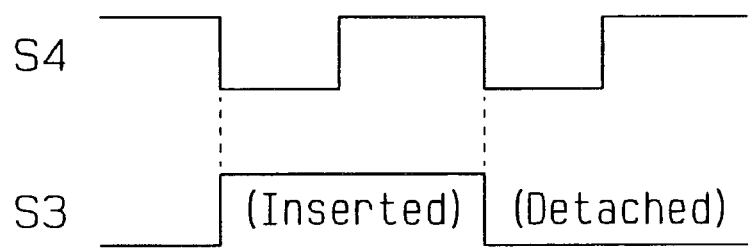
FIG. 4 is a waveform chart illustrating the operation of the card detector in FIG. 3.

The second switch SW2, which preferably comprises a momentary switch, is normally switched off. The second switch SW2 is continuously switched on or off when the card-type expansion device 21 is inserted or is detached. The insertion or detachment of the card-type expansion device 21 therefore causes a pulse signal S4 to be supplied to the clock input terminal CK of the FF circuit 35. In response to the falling of the pulse signal S4, the FF circuit 35 outputs the detection signal S3 having a high (H) level or a low (L) level. As illustrated in FIG. 4, for example, the FF circuit 35 outputs the detection signal S3 of an H level when the card-type expansion device 21 is inserted and connected to the host machine 11 and outputs the detection signal S3 of an L level when the card-type expansion device 21 is detached from the host machine 11. The CPU 32 (FIG. 2) receives the detection signal S3 from the card detector 34, and determines in accordance with the level of the detection signal S3 whether or not the card-type expansion device 21 is connected.

The CPU 32 includes a ROM 33 where a card detection program has previously been stored. The card detection program includes a program for detecting the card insertion/detachment of the card-type expansion device 21, and a program for reading the card information. The CPU 32 receives power from the high-potential power supply Vdd, executes the proper program and supplies the instruction signal S2 to the card control section 15.

The card control section 15 preferably includes a card voltage generator which generates a drive voltage Vc for operating the card main circuit 23 in the present embodiment. The card control section 15 may comprises a circuit for generating the card control signal or a combination of a card voltage generator and a card control signal generator. The card control section 15 generates the card voltage Vc having a value as specified by the supply voltage specification included in the card information. The card control section 15 supplies the card voltage Vc to the card main circuit 23 via the third terminals Ta3 and Tb3. The card main circuit 23 receives power from the card voltage Vc which allows it to provide the host machine 11 with a predetermined function.

Figure 5:
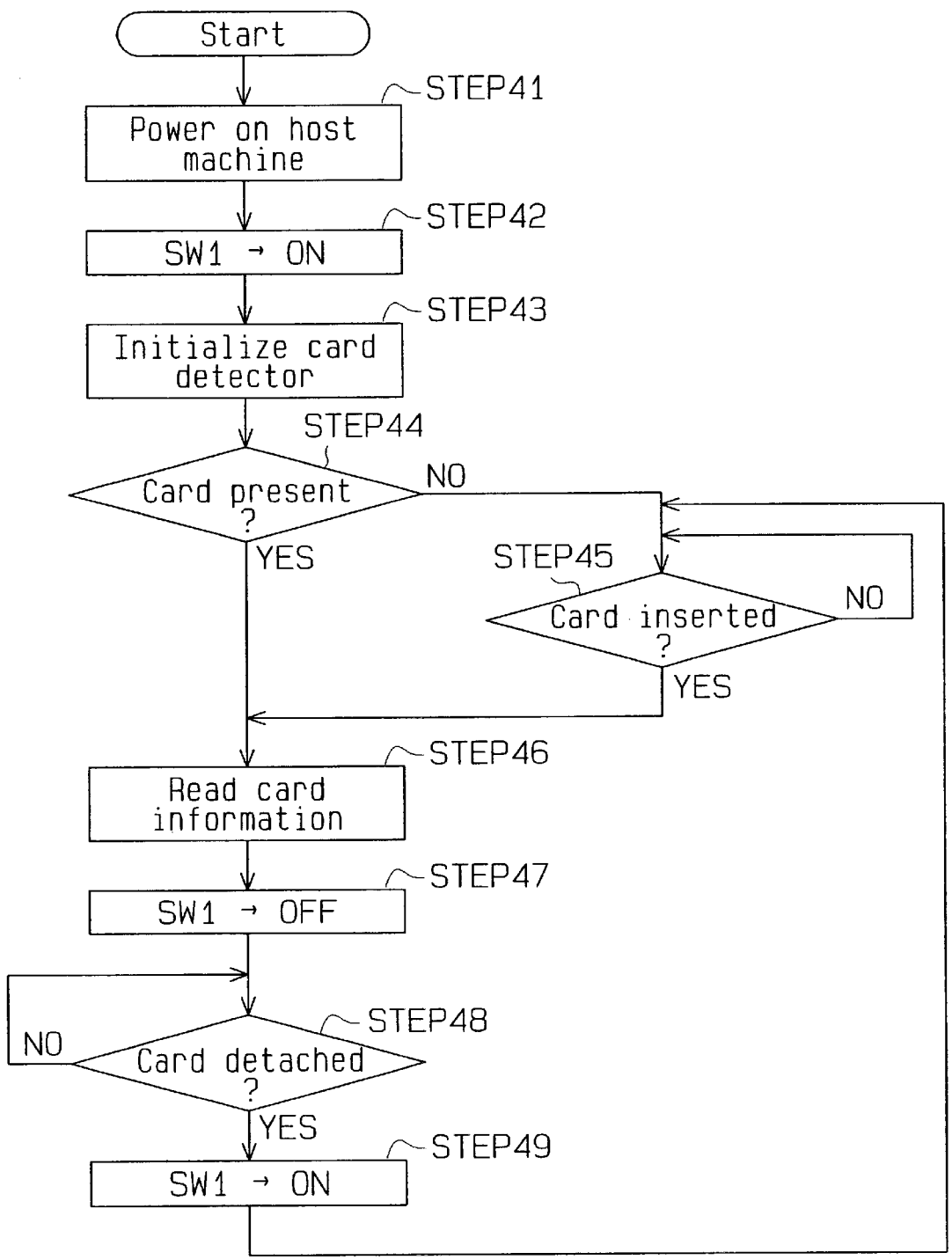
FIG. 5 is a flowchart for a card detecting process according to one embodiment of the present invention.

The operation of the CPU 32 according to the card detection program will now be discussed with reference to the flowchart in FIG. 5.

In step 41, when the host machine 11 is powered on, the CPU 32 initializes data stored in internal registers (not shown), as is known by those of ordinary skill in the art. Then, the CPU 32 switches on the first switch SW1 in FIG. 2 in step 42. In the next step 43, the CPU 32 outputs the reset signal RST to reset the FF circuit 35, which initializes the card detector 34.

In step 44, the CPU 32 determines if the card-type expansion device 21 was attached to the host machine 11 when powered on. Specifically, when the card-type expansion device 21 is attached to the host machine 11, the digital signal S1 produced by the ADC 31 from the voltage-divided voltage signal obtained by the resistor Rh of the host machine 11 and the resistor Rc of the expansion device 21 is supplied to the CPU 32. When the card-type expansion device 21 is not attached to the host machine 11, the digital signal S1 produced by the ADC 31 from the voltage signal from the high-potential power supply Vdd is supplied to the CPU 32. Based on the value of the digital signal S1 received from the ADC 31, therefore, the CPU 32 determines whether the card-type expansion device 21 is present.

When the card-type expansion device 21 is not connected to the host machine 11 at power-on, the CPU 32 determines in step 45 if the card-type expansion device 21 has later been inserted in the card slot 12, based on the detection signal S3 from the card detector 34. The CPU 32 repeatedly executes step 45 until the expansion device 21 is connected to the host machine 11. Upon detection of the card-type expansion device 21 in the card slot 12, the CPU 32 proceeds to step 46.

When the card-type expansion device 21 has already been attached to the host machine 11 (step 44) or is inserted (step 45), the CPU 32 reads the card information in step 46, based on the digital signal S1 from the ADC 31, which converts the analog voltage signal received from the card information holding section 24. The CPU 32 then supplies the instruction signal S2 to the card control section 15 in accordance with the read card information. It is preferable that the CPU 32 be connected to a display device 36, such as an LED, LCD or the like, so that the card information or a message indicating that the voltage specification is wrong may be displayed. Instead of the display device 36, communication means for informing another device of the card information or the message may be used. In response to the instruction signal S2, the card control section 15 generates the card drive voltage Vc having a value as specified by the card specifications, and supplies the card drive voltage Vc to the card main circuit 23 via the connectors 13 and 22. The card main circuit 23 receives power from the card voltage Vc and provides the host machine 11 with the function of the card. Therefore, even the attachment of the card-type expansion device 21 to the host machine 11 without checking its specifications will not damage the card-type expansion device 21 or cause the device 21 to malfunction.

In step 47, the CPU 32 switches off the first switch SW1 in order to inhibit the flow of the current across the resistor Rh while the card-type expansion device 21 is attached. This suppresses power dissipation of the host machine 11.

In step 48, based on the detection signal S3 from the card detector 34, the CPU 32 determines whether the card-type expansion device 21 remains inserted or has been detached or disconnected. The CPU 32 repeats step 48 as long as the card-type expansion device 21 is inserted, and proceeds to step 49 when the expansion device 21 is detached or disconnected from the card slot 12.

The CPU 32 sets the first switch SW1 on in step 49, and then goes to step 45. The step 45 is repeated until the card-type expansion device 21 is reconnected to the host machine 11.

According to the present embodiment, no power is supplied from the operational supply voltage Vc to the card main circuit 23 at the time of reading card information. Even if the card-type expansion device 21 is inserted in the card slot 12 without checking the specifications of the card-type expansion device 21, the card-type expansion device 21 does not malfunction. Since the ordinary method of reading card information (discussed below) supplies power from the operational supply voltage to the card main circuit 23 as soon as the expansion device 21 is connected, the expansion device 21 may malfunction when the specification on the operational supply voltage for the host machine 11 differs from that for the card-type expansion device 21 (particularly when the operational supply voltage of the card-type expansion device 21 is lower than that of the host machine 11). In a conventional card information reading method, card information prestored in the ROM of the card main circuit 23 is supplied as parallel data or serial data to the host machine 11. In this case, the card main circuit 23 needs power from the operational supply voltage in order to read card information from the ROM and send it to the host machine 11.

Figure 6:
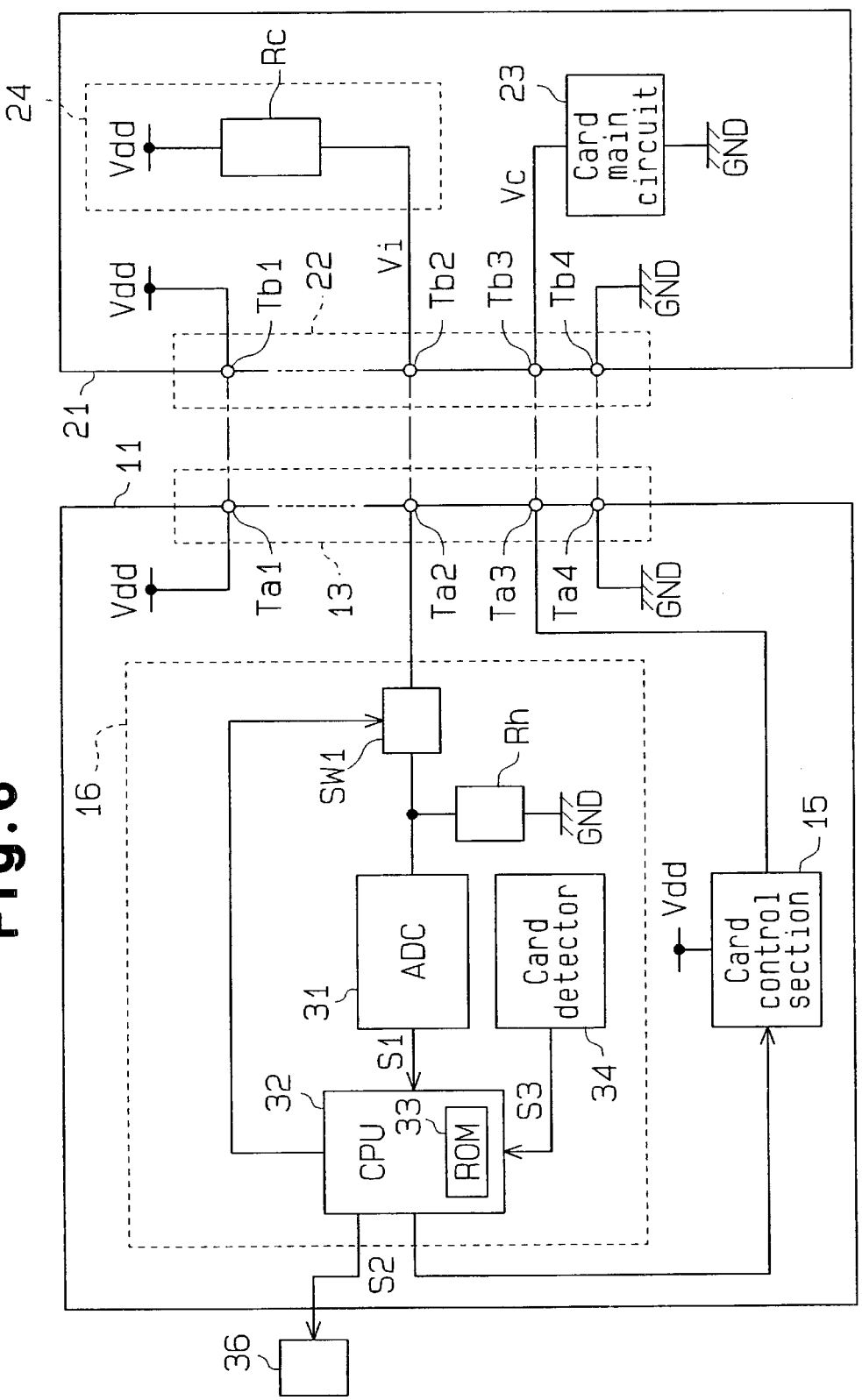
FIG. 6 is a schematic block diagram showing a card information reading section and a card information holding section according to a second embodiment of the present invention.

The present embodiment may be modified as illustrated in FIG. 6. In the card information holding section 24, the resistor Rc is connected between the high-potential power supply Vdd and the second terminal Tb2. The resistor Rh in the card information reading section 16 is connected between the second terminal Ta2 and the ground GND. The ADC 31 receives the voltage-divided voltage signal, obtained via the resistors Rc and Rh, as the analog signal Vi, and sends the digital signal S1 to the CPU 32. It is preferable that the first switch SW1 be connected between the second terminal Ta2 and the resistor Rh.

Figure 7A:
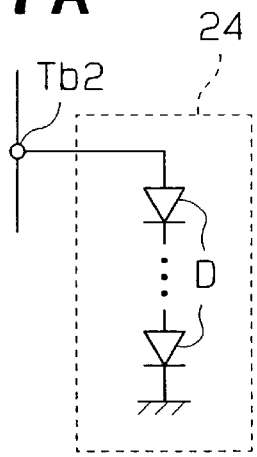
FIGS. 7A through 7F are circuit diagrams showing other examples of the card information holding section in accordance with the present invention.

The card information holding section 24 may be modified as follows. The card information holding section 24 shown in FIG. 7A includes a plurality of diodes D connected in series between the second terminal Tb2 and the ground GND. The card information holding section 24 in FIG. 7D includes a plurality of diodes D connected in series between the high-potential power supply Vdd and the second terminal Tb2. The contents of card information may be changed by changing the number of the diodes D to generate different analog voltage signals Vi. In this case, the analog voltage signal Vi in use is determined by the forward voltage of the diodes D times the number of the diodes D. The number of the diodes D is easily changed by connecting or disconnecting the diodes D. As the analog voltage signal Vi varies stepwise in accordance with the number of the diodes D, the CPU 32 accurately detects different analog voltage signals Vi or card information.

It is preferable to use a silicon diode, germanium diode or Schottky barrier diode as the diode D. The forward voltage of a silicon diode is approximately 0.6 V. In this case, the analog voltage signal Vi has a value of N (which is the number of the diodes D)×0.6 V in FIG. 7A and a value of Vdd−(N×0.6 V) in FIG. 7D. The forward voltage of a germanium diode is approximately 0.2 . In this case, the analog voltage signal Vi has a value of N×0.2 V in FIG. 7A and a value of Vdd−(N×0.2 V) in FIG. 7D. The forward voltage of a Schottky barrier diode is about 0.3 V. In this case, the analog voltage signal Vi has a value of N×0.3 V in FIG. 7A and a value of Vdd−(N×0.3 V) in FIG. 7D.

Figure 7B:
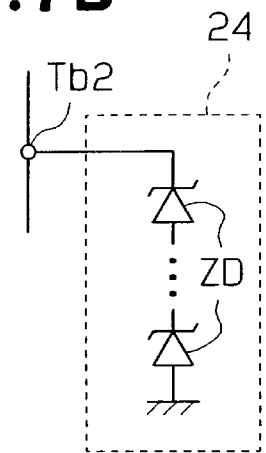

The card information holding section 24 in FIG. 7B includes a plurality of Zener diodes ZD connected in series between the second terminal Tb2 and the ground GND. The card information holding section 24 in FIG. 7E includes a plurality of Zener diodes ZD connected in series between the high-potential power supply Vdd and the second terminal Tb2. The analog voltage signal Vi has a value of N (which is the number of the Zener diodes ZD)×Vz (Zener voltage) in FIG. 7B and a value of Vdd−(N×Vz) in FIG. 7E.

Figure 7C:
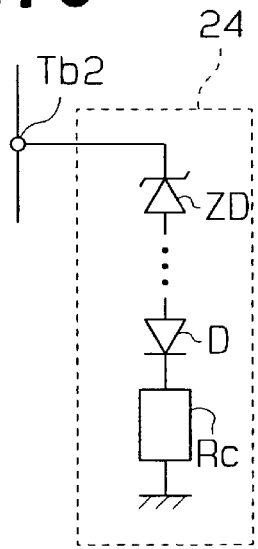
Figure 7D:
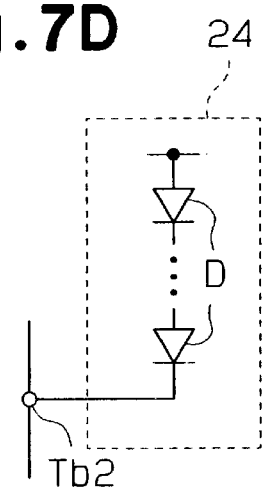
Figure 7E:
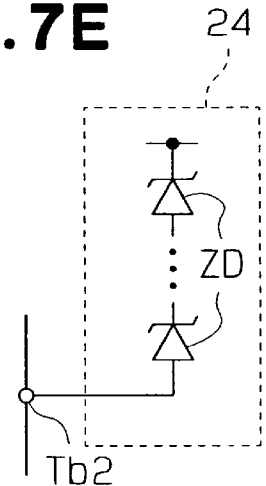
Figure 7F:
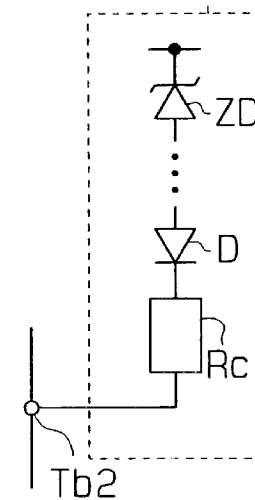

The card information holding section 24 in FIG. 7C includes a plurality of diodes D, a plurality of Zener diodes ZD and a resistor Rc all connected in series between the second terminal Tb2 and the ground GND. The card information holding section 24 in FIG. 7F includes a plurality of diodes D, a plurality of Zener diodes ZD and a resistor Rc all connected in series between the high-potential power supply Vdd and the second terminal Tb2.

The present invention may be adapted to a card-type expansion device which operates on the same operational supply voltage as the operational supply voltage Vdd of the host machine 11. In this case, the card main circuit 23 operates on power obtained from the high-potential supply voltage Vdd.

The present invention may also be adapted to the host machine 11 or the card-type expansion device 21, which has a board with a pad at one edge to be connected to the associated connector.

The card-type expansion device 21 may be connected to a host machine 11 via a drive unit (not shown). It is preferable to provide the card information reading section 16 in the drive unit. The drive unit reads card information from the card-type expansion device 21 and sends the read card information to the host machine 11.

It should be apparent to those skilled in the art that the present invention may be embodied in many other specific forms without departing from the spirit or scope of the invention. For example, the present invention may be adapted to a host machine which includes a digital camera, a digital video camera, an audio unit or the like. Therefore, the present examples and embodiments are to be considered as illustrative and not restrictive and the invention is not to be limited to the details given herein, but may be modified within the scope and equivalence of the appended claims.

What is claimed is:

1. A method of reading information stored in a card device attachable to a host machine, wherein said card device receives an operational supply voltage from said host machine, the method comprising the steps of:

attaching said card device to said host machine;

said card device generating a voltage signal corresponding to said card information stored in said card device; and said host machine acquiring said card information from said generated voltage signal, prior to supplying the operational supply voltage to said card device.

2. The method of claim 1, further comprising a step of said host machine generating a control signal for controlling said card device based on said read card information.

3. The method of claim 1, further comprising a step of said host machine supplying the operational supply voltage to said card device based on said read card information.

4. A host machine for acquiring a predetermined function from a card device having a predetermined function when said card device is connected to said host machine and receiving an operational supply voltage from said host machine, said card device having stored thereon specification information and generating an analog signal corresponding to said specification information when said card device is connected to said host machine, said host machine comprising:

a card information reading circuit for receiving said analog signal from said card device and determining said specification information based on said analog signal, prior to said host machine supplying said operation supply voltage to said card device, said card information reading circuit including an input terminal for receiving said analog signal, a resistor connected between said input terminal and a power supply which supplies said operational supply voltage and a switch connected between the power supply and the resistor, wherein when said card device is connected to said host machine, said switch is opened so that a current does not flow through the resistor and power dissipation in said host machine is suppressed.

5. The host machine of claim 4, wherein said card information reading circuit generates a card read signal indicating that said specification information has been read; and said host machine further comprises a card control circuit, connected to said card information reading circuit, for receiving the card read signal from said card information reading circuit and generating a control signal for controlling said card device.

6. The host machine of claim 5, wherein said card information reading circuit detects if said card device is connected to said host machine, and reads said specification information from said card device when said card device is connected to said host machine.

7. The host machine of claim 5, wherein said card control circuit generates said operational supply voltage to be supplied to said card device based on said card read signal.

8. The host machine of claim 4, wherein said card information reading circuit includes:

an analog-to-digital (AD) converter for receiving the analog signal from said card device and converting said analog signal to a digital signal; and a control circuit, connected to said AD converter, receiving said digital voltage signal from said AD converter, and generating an operational instruction signal corresponding to said recognized specifications.

9. A card device connectable to a host machine which receives an operational supply voltage from the host machine, the card device comprising:

a card main circuit for performing a predetermined function when supplied with the operational supply voltage from the host machine; and a card information holding circuit for storing card device specification information, wherein the card information holding circuit generates an analog voltage signal corresponding to the card device specification information when the card device is connected to the host machine and prior to the card device receiving the operational supply voltage from the host machine.

10. The card device of claim 9, wherein the card information holding circuit comprises a resistor connected between a card terminal and ground.

11. The card device of claim 9, wherein the card information holding circuit comprises a resistor connected between a card terminal and a high potential supply voltage.

12. The card device of claim 9, wherein the card information holding circuit comprises a plurality diodes connected in series between a card terminal and a high potential supply voltage.

13. The card device of claim 9, wherein the card information holding circuit comprises a plurality diodes connected in series between a card terminal and ground.

14. The card device of claim 9, wherein the card information holding circuit comprises:

a plurality of series connected diodes;

a plurality of series connected Zener diodes; and a resistor, wherein the series connected diodes, the series connected Zener diodes and the resistor are connected in series with each other between a card terminal and ground.

15. The card device of claim 9, wherein the card information holding circuit comprises:

a plurality of series connected diodes;

a plurality of series connected Zener diodes; and a resistor, wherein the series connected diodes, the series connected Zener diodes and the resistor are connected in series with each other between a card terminal and a high potential supply voltage.

16. The card device of claim 9, further comprising:

a first terminal connectable to a first terminal of the host machine for receiving a high potential supply voltage from the host machine;

a second terminal connectable to a second terminal of the host machine for providing the analog signal to the host machine;

a third terminal connectable to a third terminal of the host machine for receiving a card control signal from the host machine; and a fourth terminal connectable to a fourth terminal of the host machine for receiving a low potential supply voltage from the host machine.

* * * * *

UNITED STATES PATENT AND TRADEMARK OFFICE
CERTIFICATE OF CORRECTION

PATENT NO.: 6,052,742
DATED : April 18, 2000
INVENTOR(S): Masaki KIRINAKA, et al.

It is certified that an error appears in the above-identified patent and that said Letters Patent is hereby corrected as shown below:

Col. 8, line 60, after "voltage" insert --,--.

Signed and Sealed this

Sixth Day of March, 2001

Attest:

NICHOLAS P. GODICI

Attesting Officer     Acting Director of the United States Patent and Trademark Office